(12) United States Patent
Dean

(10) Patent No.: US 8,275,012 B2
(45) Date of Patent: Sep. 25, 2012

(54) LASER DIODE READ DRIVER

(75) Inventor: Douglas Warren Dean, Eagan, MN (US)

(73) Assignee: Texas Instruments Incorporated, Dallas, TX (US)

( * ) Notice: Subject to any disclaimer, the term of this patent is extended or adjusted under 35 U.S.C. 154(b) by 251 days.

(21) Appl. No.: 12/645,823

(22) Filed: Dec. 23, 2009

(65) Prior Publication Data

US 2010/0315929 A1 Dec. 16, 2010

Related U.S. Application Data

(60) Provisional application No. 61/186,299, filed on Jun. 11, 2009.

(51) Int. Cl.
*H01S 3/00* (2006.01)
(52) U.S. Cl. .................. 372/38.02; 372/38.1; 372/38.07
(58) Field of Classification Search .................. 372/38.1, 372/38.02, 38.07
See application file for complete search history.

(56) References Cited

U.S. PATENT DOCUMENTS

| | | | | |
|---|---|---|---|---|
| 7,154,923 B2 * | 12/2006 | Kucharski | ................ | 372/29.015 |
| 7,324,570 B2 * | 1/2008 | Moran | ............................ | 372/26 |
| 7,449,873 B2 * | 11/2008 | Schaffer et al. | ................ | 323/315 |
| 7,609,098 B2 * | 10/2009 | Bergmann | ..................... | 327/108 |
| 2005/0195869 A1 * | 9/2005 | Kubota | ....................... | 372/38.02 |

* cited by examiner

*Primary Examiner* — Yuanda Zhang
(74) *Attorney, Agent, or Firm* — Lawrence J. Bassuk; W. James Brady; Frederick J. Telecky, Jr.

(57) ABSTRACT

A first transistor produces a first voltage in response to a first current signal. A first resistor is coupled between the first transistor and a low voltage supply. A transconductor has a first input receiving the first voltage and producing a second current signal in response to differences between signals received on the first input and a second input. A second transistor is coupled to the second input and produces a third current signal in response to the second current signal. A third transistor, coupled to the second transistor and the second input, produces an output current signal in response to the third current signal. The first transistor is scaled to the third transistor by the inverse of a gain factor. A second resistor is coupled between the third transistor and a low voltage supply. The first resistor is scaled to the second resistor by the gain factor.

4 Claims, 5 Drawing Sheets

LASER DIODE READ DRIVER

CROSS REFERENCE TO RELATED APPLICATION(S)

The present application claims priority to jointly owned U.S. Provisional Application corresponding to application No. 61/186,299 entitled "Laser Diode Read Driver." This provisional application was filed on Jun. 11, 2009.

DESCRIPTION OF RELATED ART

With the evolution of electronic devices, there is a continual demand for enhanced speed, capacity and efficiency in various areas including electronic data storage. Motivators for this evolution may be the increasing interest in video (e.g., movies, family videos), audio (e.g., songs, books), and images (e.g., pictures). Optical disk drives have emerged as one viable solution for supplying removable high capacity storage. When these drives include light sources, signals sent to these sources should be properly processed so these sources emit the appropriate light for reading and writing data optically.

BRIEF DESCRIPTION OF THE DRAWINGS

The laser diode read driver within the laser diode driver signal processing system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1A:
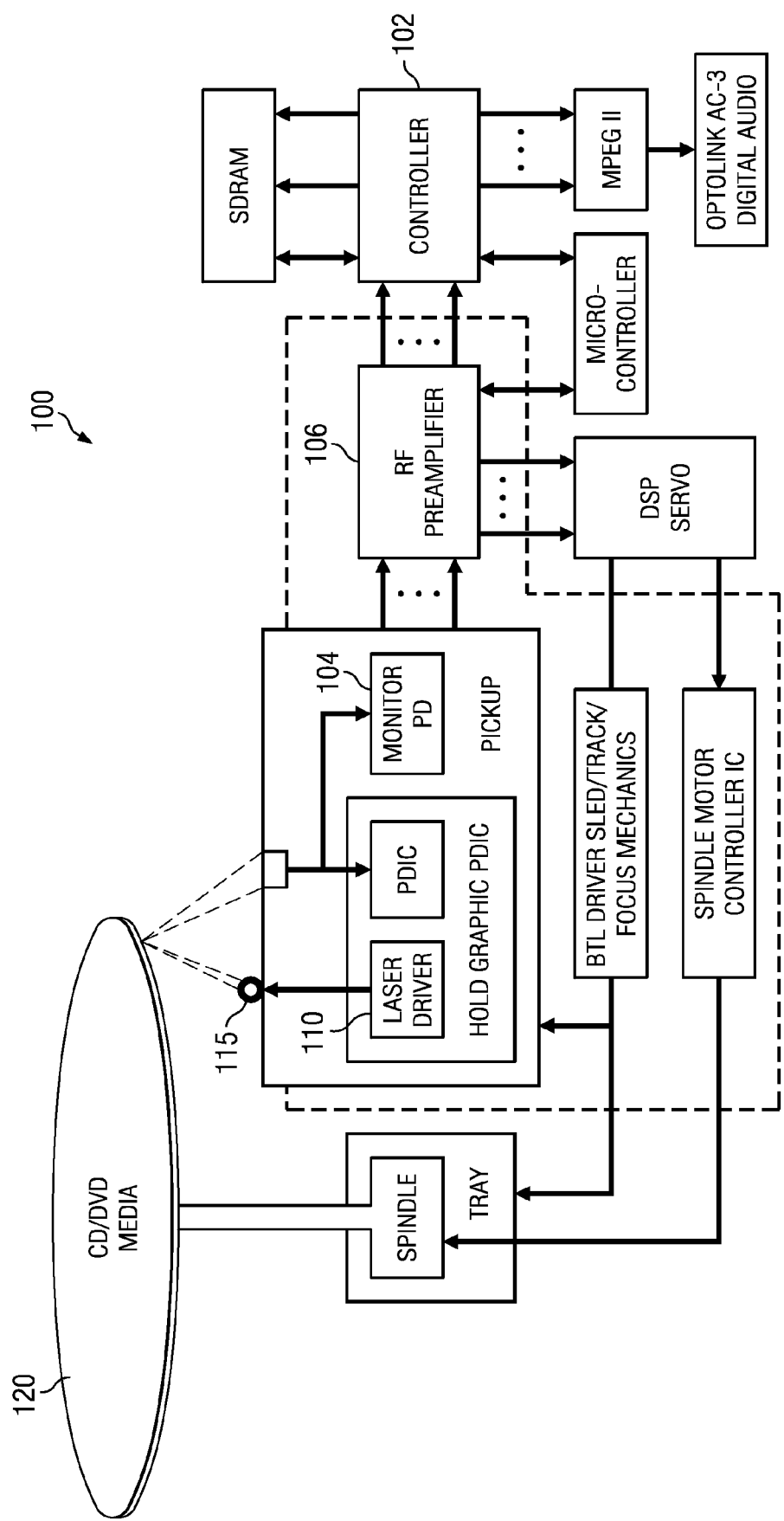
FIG. 1A, is a system drawing illustrating components within an optical disk drive

While the laser diode read driver is susceptible to various modifications and alternative forms, specific embodiments have been shown by way of example in the drawings and subsequently are described in detail. It should be understood, however, that the description herein of specific embodiments is not intended to limit the motion conversion system to the particular forms disclosed. In contrast, the intention is to cover all modifications, equivalents, and alternatives falling within the spirit and scope of the motion conversion as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Turning now to FIG. 1A, is a system drawing illustrating components within an optical disk drive 100. A controller 102 monitors the output light power level of a laser diode 115 using a Monitor PD 104, or monitor photodiode, and an RF, or radio frequency, preamplifier 106. This controller can keep an expected power level by changing an input control current of a laser driver 110 through an APC, or auto power controlling, feedback loop, even if a light source 115 such as a laser diode, has many changes of the output power due to various condition changes, such as temperature etc.

Also, the controller 102 sets the enable signal for switching some current channels of the laser driver 110, which arranges a data writing pulse. In the case of data reading, the controller 102 may only set the DC current by disabling the switching and applying the designated current. In the case of data writing, the controller 102 applies some adjustment signals, or enable-switching signals, to arrange the writing pulse waveform as a combination of switched current pulses. The power level can be changed as each switching channel has its own designated current. The controller 102 can arrange these designated currents based on the Monitor PD 104 output with some detecting function in the RF preamplifier 106. At the very least, this controller has two power control levels, one for the read power and one for the write power. Sometimes the controller may get the top, bottom, or average level of a writing pulse and perform calculations to control some power levels independently.

As illustrated in this figure, the laser driver 110 sends a signal that prompts an associated light source 115 (e.g., laser diode) to emit light. The light source 115 may emit light at any of a number of wavelengths (e.g., 400 nm, 650 nm, 780 nm) Light from this source contacts an associated optical media 120, such as a compact disc (CD), blue ray device (Blu-ray), or digital versatile disk (DVD). Light contacting the optical media can either facilitate data storage or data retrieval from the optical media 120.

Figure 1B:
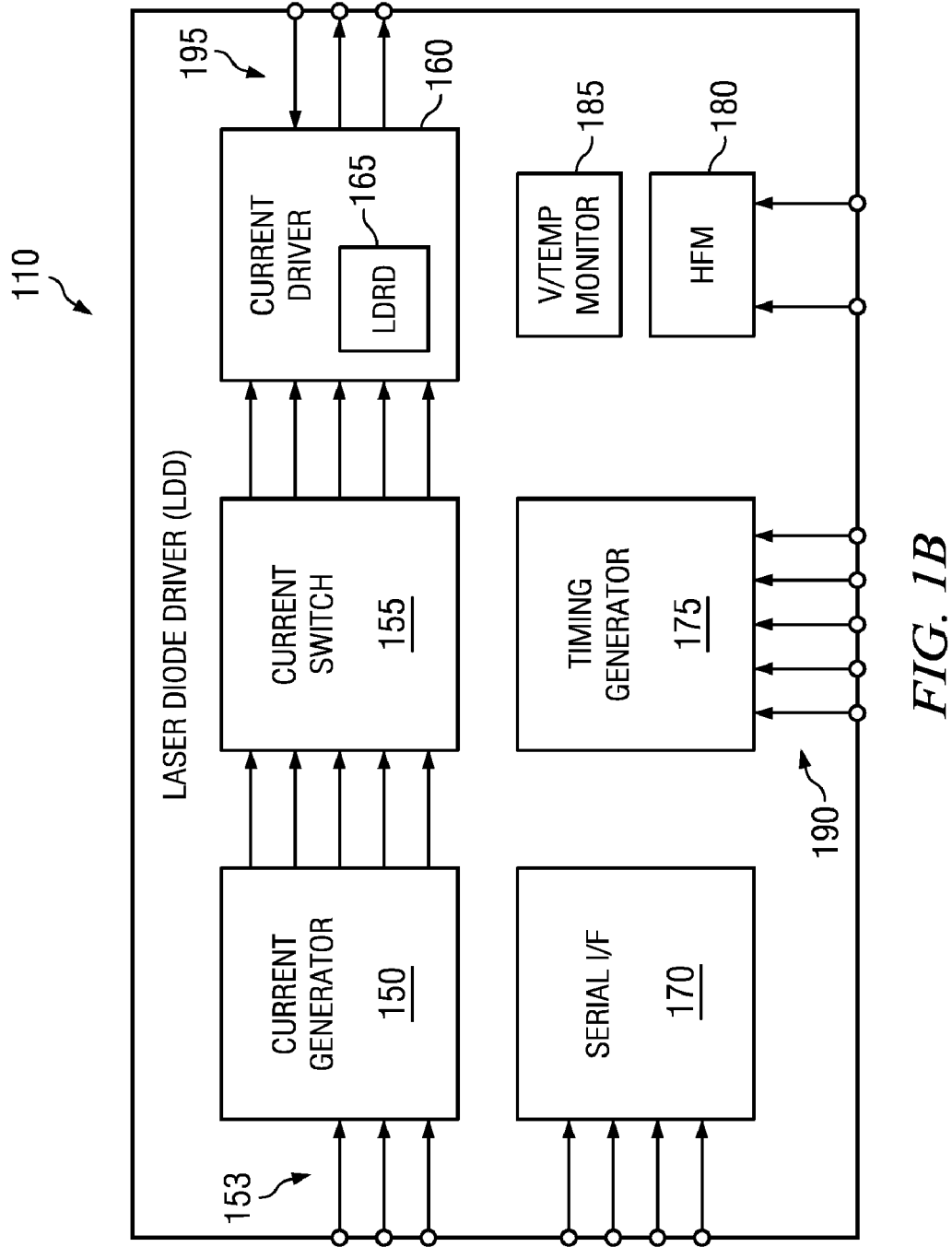
FIG. 1B is an enlarged view of the innovative laser driver, which may be a laser diode drive (LDD).

FIG. 1B is an enlarged view of the innovative laser driver 110, which may be a laser diode driver (LDD). The LDD 110 is an integrated, fully programmable, multi-function product that controls and drives lasers within optical drives as described with reference to FIG. 1A. More specifically, the LDD 110 can facilitate reading, writing, and erasing high capacity disks (e.g., capacities greater than approximately 50 Gbytes/disk). The LDD 110 also has low noise (e.g., noise of approximately 0.5 nA/Hz^2), high speed (e.g., 800 Mb/s) and high current (e.g., approximately 1 amp). Any numbers included in this application are for illustrative purposes only and numerous alternative implementations may result from selecting different quantitative values.

At a high level, the LDD 110 may include a current generator 150. Generally, the current generator 150 receives some input signals associated with several input channels 153, which have an associated input current. This current generator 150 works in tandem with a current driver 160 and scales the input current by some gain factor. As a result, the current generator 150 and current driver 160 can control the amount of current for each output channel 195. For the input signals that the current generator 150 receives, it transmits output signals that a current switch 155 receives. The current switch 155 decides which of the input channels should be turned on or turned off. For the channels that should be turned on, the current switch 155 makes those channels active. Similarly, the current switch 155 inactivates the channels that should be turned off and transmits output signals reflecting this change. The current driver 160 receives these output signals from the current switch 155 as input signals. This current driver is the last current gain stage and drives the laser diode directly. In other words, the output signals from the current driver 160 also serve as output signals for the LDD 110, which are used in driving the lasers, or light source 115.

In addition to the above-mentioned devices, the LDD 110 includes additional components. A serial interface (I/F) 170 has several inputs (e.g., serial data enable, serial data, serial clock) that may be used for programming the gain, enabling channels, and turning on the LDD. The timing generator 175 receives various channel enable inputs 190. Though there are five channel enable inputs that are shown in FIG. 1B, the LDD 110 may have any number of channel enable inputs, such as two, six, or the like. The timing generator 175 determines the time at which a given output channel will be either turned on or turned off. The LDD 110 also includes a high frequency modulator (HFM) 180 and voltage/temperature monitor (V/Temp Monitor) 185. The HFM 180 modulates the output current for mode-hopping noise reduction of the laser diodes. The voltage/temperature monitor 185 monitors the laser diode voltage drop and on-chip temperature. One skilled in the art will appreciate that numerous alternative implementations may result from either adding or removing any or several of the blocks within the LDD 110.

Though not illustrated, an integrated circuit for the LDD 110 generally has four switching, or write channels and one static, or read channel. The read channel should accommodate a very large dynamic range from several milliamps to hundreds of milliamps with good accuracy. Another design constraint is that the associated integrated circuit should have very low noise and be essentially immune to coupling from the switching channels. To meet these constraints, the LDD 110 includes a Laser Diode Read Driver (LDRD) 165. The LDRD 165 has a large dynamic range, low noise, good accuracy, and is essentially immune to the switching channels coupling; in other words, this LDRD does not ring. The output of the LDRD 165 can become the output of the LDD 110. The input comes from the current generator block 150.

Figure 2:
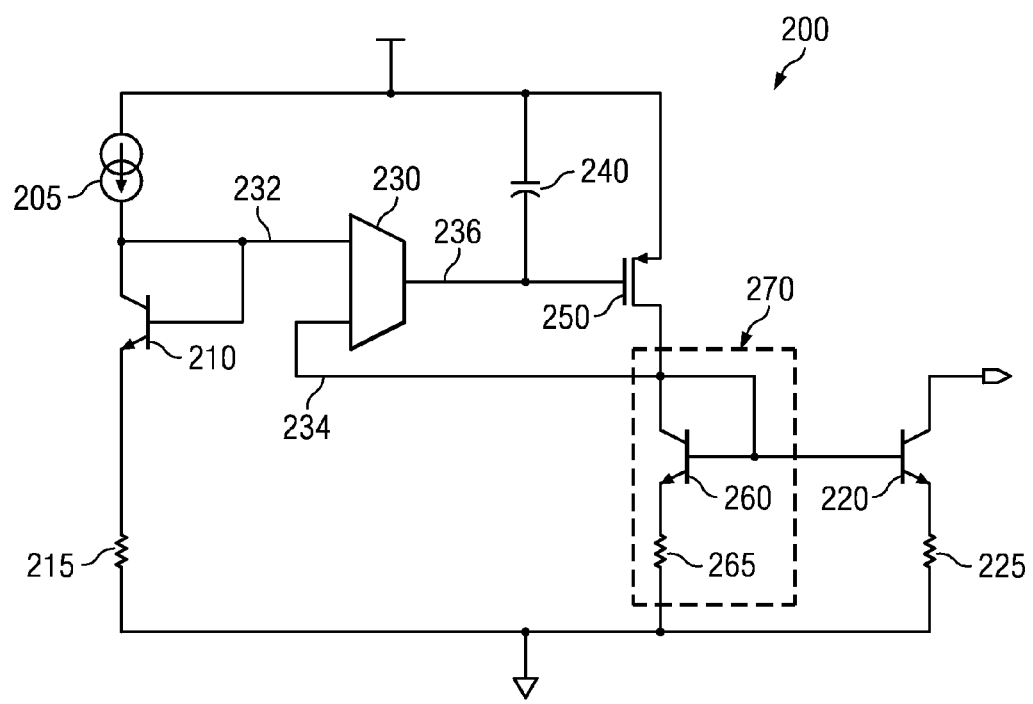
FIG. 2 is a simplified circuit diagram for a first implementation of the LDRD that sinks current.

FIG. 2 is a simplified circuit diagram 200 for a first implementation of the LDRD 165 that sinks current. For this implementation, the laser diode's cathode connects to the pin $I_{OUT}$ and the laser diode's anode connects to a positive voltage supply. When there is a desired output current, the LDRD 165 can be designed to produce this desired current as illustrated in the circuit diagram 200. For example, the desired output current may be $I_{OUT}$ and the circuit diagram 200 may have a gain K associated with it. To produce this output current, the circuit diagram 200 receives an input reference current $I_{OUT}/K$ shown as current source 205, where K is the gain factor; this input current comes from a previous stage in the current generator block 150. As this reference current enters this circuit, the current reaches ground by traveling through transistor 210 and resistor 215. While the transistor 210 is shown as an npn bipolar junction transistor, other implementations may result from using different transistor types. The transistor 210 is also a diode-connected transistor. The size of transistor 210 can be scaled to an output transistor 220 by the inverse of the gain factor, or 1/K, (e.g., area of transistor 210 may equal area of transistor 220*1/K). As current flows from current source 205 through transistor 210, it reaches resistor 215 and then encounters ground. As transistor 210 is scaled to transistor 220, resistor 215 can be scaled to the output resistor 225; for example, the value of resistor 215 can be the product of resistor 225 and the gain K. Matching the device 210 with the device 220 and the device 215 with the device 225 can improve the accuracy of the output current in relation to the input current $I_{OUT}/K$.

The input reference current $I_{OUT}/K$ 205 sets a reference voltage at the $V_N$ terminal 232 of the transconductor 230. The transconductor 230 has two input terminals and produces a current signal reflective of differences between signals received on its input terminals. As mentioned above, the transconductor 230 includes a $V_N$ terminal 232 and $V_P$ terminal 234 where $V_N$ is the voltage applied to the terminal 232 and $V_P$ is a voltage applied to the terminal 234. The values for these voltages may be the sum of $(I_{OUT}/K)*$Resistor 215 and the voltage of diode connected transistor 210, or the like. The transconductor 230 produces an output current signal on terminal 236 that reflects a difference of the signals received on the terminal 232 and the terminal 234. The output current signal has an associated output current I where I=GM*(VP−VN). In this formula, GM is the transconductance of the transconductor 230, which may have a value of 20 uS or the like.

As the output current signal emerges from the transconductor 230, it drives the capacitor 240. The size of this capacitor for this particular application is around 15 pF The capacitor 240 can filter noise present in the output current signal that may be associated with a previous stage in the laser diode driver 110. In other words, noise in the output signals from the current generator 150 (see FIG. 1B) may appear as noise on the input terminal 232, which would appear as noise in the output current signal on the terminal 236. It is this noise in the output current signal that capacitor 240 can filter. The size for this capacitor may be selected based on design parameters to get a desired amount of filtering.

The output current signal from the transconductor 230 also drives a metal oxide semiconductor (MOS) transistor 250. While shown as a MOS transistor, one skilled in the art will appreciate that the specific type of transistors within the LDRD 165 and the circuit 200 may vary depending on design objectives. This output current signal drives the gate of the transistor 250 to a voltage such that the voltage $V_P$ equals the voltage $V_N$ by outputting a current into the transistor 260 and the resistor 265, which goes to a low voltage supply, which is typically ground. The size of the transistor 260 can scale to the transistor 210 or the transistor 220, if desired. Similarly, the resistance of the resistor 265 can scale to the resistor 215 or the resistor 225, if desired. In addition, the transistor 260 and the resistor 265 form a current mirror 270 that connects to the base of output transistor 220, the terminal 234 of the transconductor 230, the drain of the transistor 250, and the low voltage supply or ground.

The LDRD 165 illustrated by the circuit diagram 200 has an effective operation. As briefly mentioned above, this circuit diagram includes a high voltage supply $V_{cc}$, which may have a voltage of approximately 5V associated with it. Current Source 205, capacitor 240, and transistor 250 all connect to this voltage supply. In contrast, resistors 215, 225, and 265 all connect to the low voltage supply, or ground. Due to the closed loop or the connection of the current mirror leg 270, the transconductor 230, and transistor 250, the voltage at the base of the transistor 260 and the base of the transistor 220 will be the same as the voltage on the base of the transistor 210. In other words, the voltage Vn at the base of transistor 210 terminal 232 equals the voltage Vp on terminal 234 as explained above, which is applied to the bases of the transistor 220 and transistor 260. Because transistor 220 and resistor 225 are scaled to the transistor 210 and the resistor 215, the output current $I_{out}$ or current emerging from the LDRD 165 and the circuit diagram 200 will be a scaled replica of the input current by the gain factor K.

High frequency coupling from the collector-base junction of Q2 is also filtered by the loop. As coupling current is injected into node 232, the transconductor 230 will respond by outputting a current, but it will only respond as fast as the loop frequency response, which is dictated by several parameters, specifically, the value of transconductance and the value of capacitance for capacitor 240.

Figure 3:
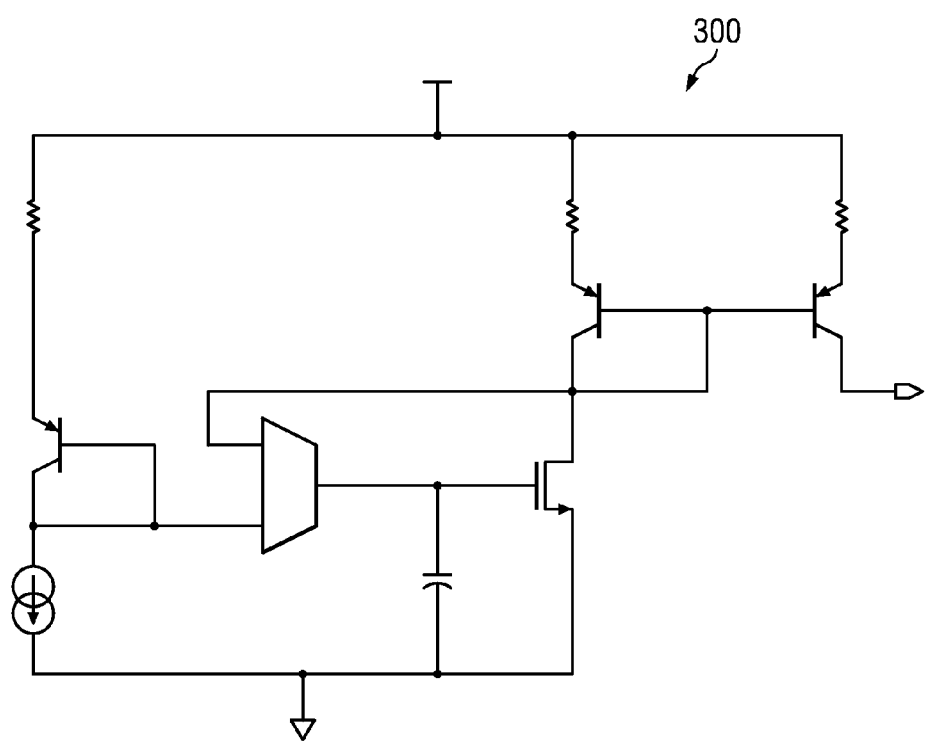
FIG. 3 is a simplified circuit diagram for a second implementation of the LDRD that sources current.

The simplified circuit diagram 200 is merely one of many possible implementations of the LDRD 165. In fact, numerous alternative implementations can result, without departing from the inventive aspect described in this document. For example, an alternative implementation can result from removing the current mirror leg 270. Another alternative implementation can result from replacing the current mirror 270 with a passive device (e.g., a resistor). FIG. 3 is a simplified circuit diagram 300 for a second implementation of the LDRD 165 that sources current. In this implementation, the laser diode cathode is connected to ground, while the laser diode's anode is connected to the pin $I_{OUT}$. One skilled in the art will appreciate that the circuit diagram 300 is essentially "flipped" relative to the circuit diagram 200. Because the description of the operation of circuit diagram 200 is applicable to the circuit diagram 300, the operation of the circuit diagram 300 is not separately described.

Figure 4:
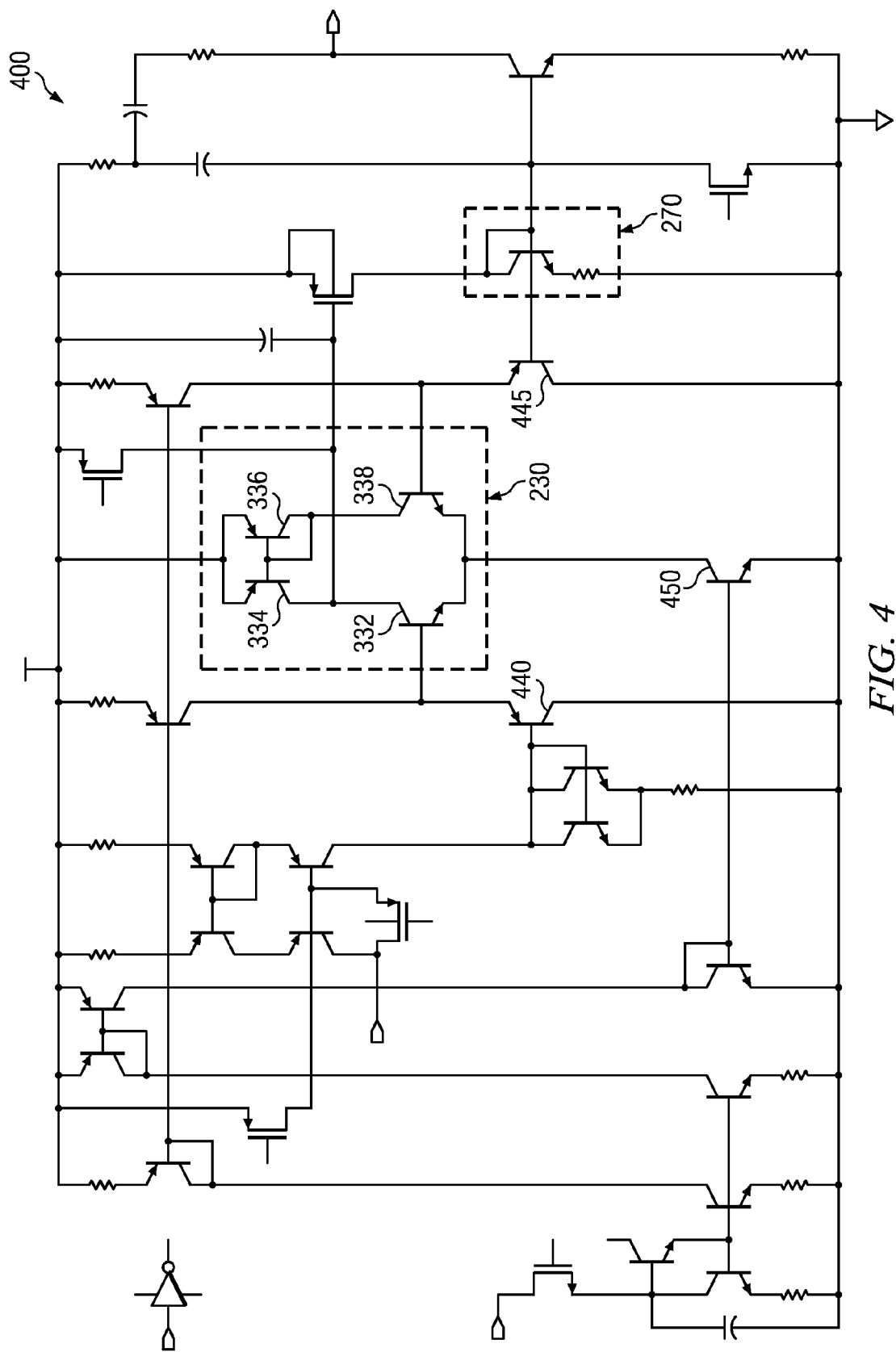
FIG. 4 is one implementation of a detailed circuit diagram of the LDRD that sinks current.
Figure 5:
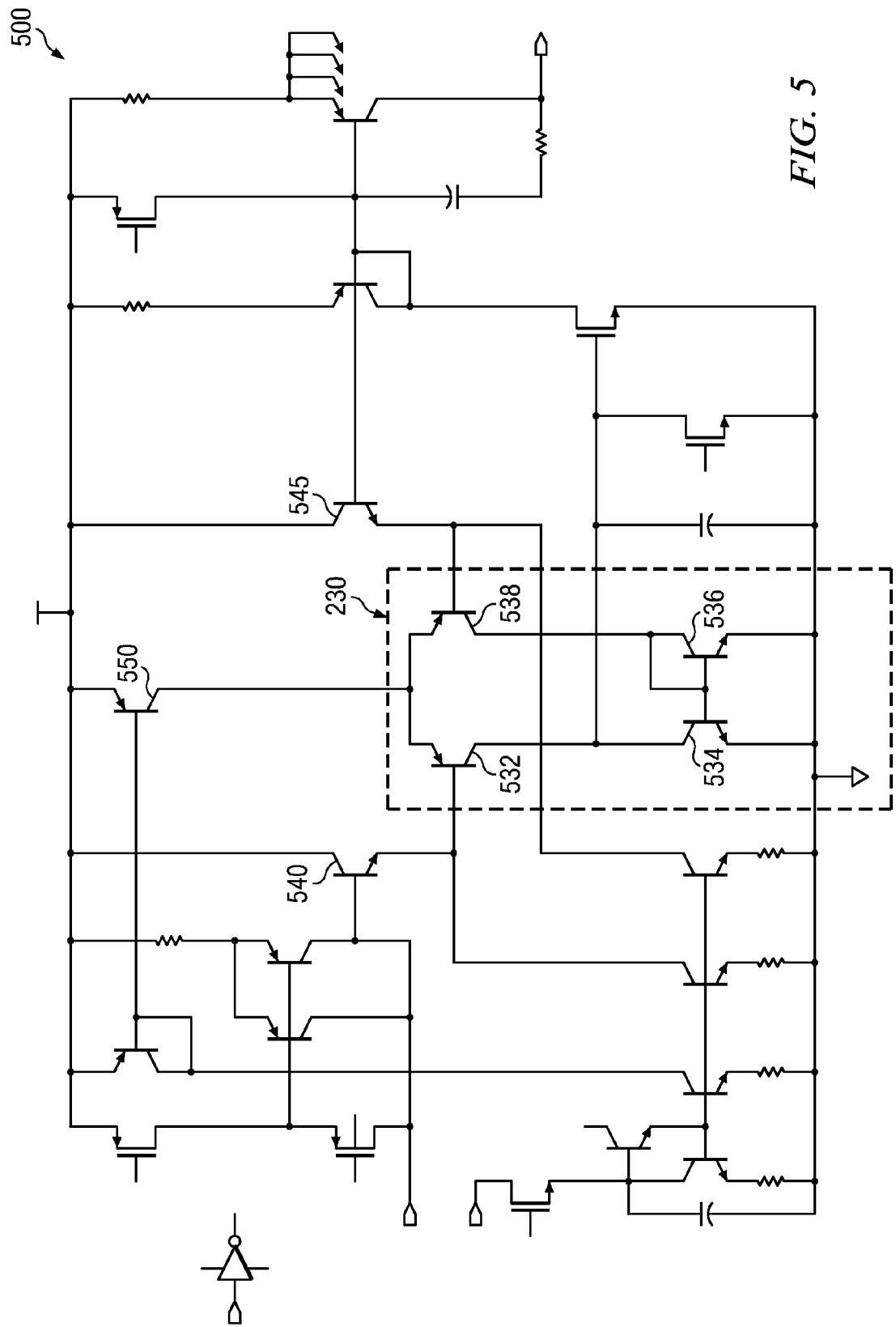
FIG. 5 is an actual circuit diagram of a laser read driver that sources current.

FIG. 4 is one implementation of a detailed circuit diagram 400 of the LDRD 165 that sinks current; this operates generally as described with reference to FIG. 2. This circuit diagram includes a current mirror that provides bias current for the cell's operation; a current mirror that attenuates an input bias current to be used for the transconductor 230. As illustrated, the transconductor 230 may be composed of four transistors 332-338. The current mirror 270 is also shown as a transistor and resistor, but other alternatives are possible. The circuit diagram 100 also includes transistor 440 and transistor 445 that are connected to the input terminals of the transconductor 230. These transistors act as emitter followers into the inputs of the transconductor 230. In other words, they shift the voltage up by a diode so the circuit has enough headroom for proper operation. A transistor 450 sets a tail current for the transconductor 230, which determines the frequency response of the current mirror. Like FIG. 3, FIG. 5 is a second implementation of a circuit diagram 500 that sources current with some similar components to the components described with reference to FIG. 4. In this implementation, the transconductor 230 includes transistors 532-538; transistors 540, 545 act as emitter followers into the inputs of the transconductor 230. The transistor 550 sets the tail current for this transconductor.

The LDRD 165 provides a very accurate representation of the input current as scaled by a gain factor at the output for a very large dynamic range. This innovative LDRD can use very little power depending on the selected gain, device sizes, and resistor sizes. In addition, noise from prior stages can be easily filtered without ringing due to high frequency coupling. Unlike conventional solutions, the LDRD 165 does not sacrifice accuracy or require a beta-helper.

While various embodiments of the laser diode read driver have been described, it may be apparent to those of ordinary skill in the art that many more embodiments and implementations are possible that are within the scope of this system. Although certain aspects of the laser diode read driver may be described in relation to specific techniques or structures, the teachings and principles of the present system are not limited solely to such examples. All such modifications are intended to be included within the scope of this disclosure and the present laser diode read driver and protected by the following claim(s).

The invention claimed is:

1. A laser diode read driver, comprising:
a first transistor operative for producing a first voltage in response to receiving a first current signal;
a first resistor coupled between the first transistor and a low voltage supply;
a first transconductor having a first input coupled to receive the first voltage, wherein the transconductor produces a second current signal in response to differences between signals received on the first input and a second input;
a second transistor coupled to the second input, and operative for producing a third current signal in response to receiving the second current signal;
a third transistor coupled to the second transistor and the second input, the third transistor operative for producing an output current signal in response to receiving the third current signal, wherein the first transistor is scaled to the third transistor by the inverse of a gain factor; and
a second resistor coupled between the third transistor and the low voltage supply, wherein the first resistor is scaled to the second resistor by the gain factor.

2. The laser diode read driver of claim 1, including a third resistor coupled between the second transistor and the low voltage supply.

3. The laser diode read driver of claim 1, including a capacitor coupled to the output of the transconductor, the second transistor, and a high voltage supply, wherein the capacitor is operative for filtering noise from the output current signal.

4. The laser diode read driver of claim 1 in which the third transistor is coupled to the second input and the second transistor to filter high frequency coupling associated with an output transistor.

* * * * *